United States Patent
Huang et al.

(10) Patent No.: US 8,202,752 B2
(45) Date of Patent: Jun. 19, 2012

(54) METHOD FOR FABRICATING LIGHT EMITTING SEMICONDUCTOR DEVICE FOR REDUCING DEFECTS OF DISLOCATION IN THE DEVICE

(75) Inventors: Shih Cheng Huang, Hsinchu (TW); Po Min Tu, Chiayi County (TW); Ying Chao Yeh, Taipei County (TW); Wen Yu Lin, Taichung County (TW); Peng Yi Wu, Taichung (TW); Shih Hsiung Chan, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 144 days.

(21) Appl. No.: 12/488,875

(22) Filed: Jun. 22, 2009

(65) Prior Publication Data

US 2009/0315067 A1   Dec. 24, 2009

(30) Foreign Application Priority Data

Jun. 24, 2008   (TW) ................................ 97123450 A

(51) Int. Cl.
*H01L 21/00* (2006.01)
*H01L 21/338* (2006.01)

(52) U.S. Cl. .............................. 438/47; 438/94; 438/172

(58) Field of Classification Search ..................... 438/47, 438/94, 172
See application file for complete search history.

(56) References Cited

U.S. PATENT DOCUMENTS

| | | | |
|---|---|---|---|
| 6,345,063 B1 | 2/2002 | Bour et al. | |
| 6,462,357 B1 | 10/2002 | Tsai et al. | |
| 6,534,332 B2 | 3/2003 | Bourret-Courchesne | |
| 6,627,974 B2 | 9/2003 | Kozaki et al. | |
| 6,794,210 B2 | 9/2004 | Ouchi et al. | |
| 6,861,270 B2 | 3/2005 | Sakai | |
| 7,098,484 B2 | 8/2006 | Yamanaka et al. | |
| 7,135,716 B2 | 11/2006 | Kim et al. | |
| 7,390,684 B2 * | 6/2008 | Izuno et al. | 438/29 |
| 7,615,772 B2 | 11/2009 | Lee | |
| 2008/0116478 A1 * | 5/2008 | Miki et al. | 257/103 |
| 2009/0140286 A1 * | 6/2009 | Takeda | 257/103 |

FOREIGN PATENT DOCUMENTS

| | | |
|---|---|---|
| CN | 1484324A A | 3/2004 |
| CN | 1659715A A | 8/2005 |
| JP | 2002-170776 A | 6/2002 |
| JP | 2007-335484 A | 12/2007 |
| JP | 2008-047762 * | 2/2008 |
| JP | 2008-124060 * | 5/2008 |

* cited by examiner

*Primary Examiner* — James Mitchell
(74) *Attorney, Agent, or Firm* — Altis Law Group, Inc.

(57) ABSTRACT

A semiconductor device fabrication method is disclosed. A buffer layer is provided and a first semiconductor layer is formed on the buffer layer. Next, a first intermediate layer is formed on the first semiconductor layer by dopant with high concentration during an epitaxial process. A second semiconductor layer is overlaid on the first intermediate layer. A semiconductor light emitting device is grown on the second semiconductor layer. The formation of the intermediate layer and the second semiconductor layer is a set of steps.

9 Claims, 8 Drawing Sheets

METHOD FOR FABRICATING LIGHT EMITTING SEMICONDUCTOR DEVICE FOR REDUCING DEFECTS OF DISLOCATION IN THE DEVICE

BACKGROUND OF THE INVENTION

1. Field of the Invention

The present invention relates to a semiconductor device fabrication method and structure thereof, and relates more particularly to a semiconductor device fabrication method for reducing the defects of dislocation existing in the device.

2. Description of the Related Art

The spectrum of light emitted by the Group III nitride-based semiconductor material ranges from the wavelength of visible light to that of UV light. Furthermore, the Group III nitride-based semiconductor material is a direct transition material so it is widely applied to light emitting diodes (LEDs), laser diodes, light emitting devices, and so on.

Currently, the methods for fabricating high-quality Group III nitride-based semiconductor material devices generally includes growing Group III nitride-based semiconductor material layers on a suitable but imperfect substrate such as a sapphire substrate, a silicon substrate, a GaAs substrate, a silicon carbide (SiC) substrate, or analogous hetero-epitaxial substrates. However, for all such hetero-epitaxial substrates, lattice mismatch and thermal mismatch occur in the process of depositing a high-quality Group III nitride-based semiconductor material layer. The lattice mismatch results from the different intervals between the atoms of crystals, and the thermal mismatch results from the different thermal expansion coefficients of the various materials.

The differences between the lattice constants of silicon carbide and GaN group compound are around 3%. The differences between the lattice constants of sapphire and GaN group compound are around 13%. During the epitaxial process, the lattice mismatch often causes the dislocation problem. That is, the epitaxial device has the defects of line dislocations which are longitudinally (the direction perpendicular to the surface of the substrate) through the crystals. Generally, the Group III nitride-based semiconductor device has line dislocations with a density of $10^9/cm^2$. These numerous line dislocations can penetrate each of the Group III nitride-based semiconductor layers composing of different materials up to the top layer. Consequently, the device is cracked by the line dislocations. In view of the aforesaid problems, the threshold current of the laser diodes and the working life and the reliability of the LEDs and the laser diodes are accordingly reduced.

Furthermore, the thermal mismatch should be noticeable. After the Group III nitride-based semiconductor material is grown on the substrate and the device (a sample) is cooled, the differences between the speeds of the thermal contraction of two materials cause high stress. The stress is directly related to the thickness of the deposited film layer, and, particularly, is directly proportional to the thickness. For example, the thermal expansion coefficient of sapphire is greater than that of GaN. When a sapphire substrate and a GaN layer are cooled simultaneously, the thermal mismatch between them causes compression stress on the GaN layer and tensile stress on the sapphire substrate. When the thickness of the layer is larger than 10 μm and the GaN layer is unable to withstand the compression stress, cracks are likely to occur in the layer.

The broad defects (line dislocations, and misfit dislocations) existing in the device dramatically and accordingly reduce its efficiency and working life. In particular, the occurrence of the dislocation seems to result in the center of the non-radiative recombination so the lighting efficiencies of LEDs and laser diodes composed of these materials are reduced. Furthermore, the occurrence of the dislocations also increases dark current. Even though the problem of the line dislocations does not block the development of the extremely bright LED, the dislocations cause p-n junction devices such as transistors with high electronic mobility, field effect transistors (FET), and other similar devices to have excessive reversely biased leakage current. The occurrence of the dislocation results in the strong light scattering center of carriers so that the mobility of the electrons and holes is reduced. The performance of various semiconductor devices is limited by the dislocations.

U.S. Pat. No. 6,534,332 discloses a method of manufacturing a GaN thin film. As shown in the schematic diagram of a structure 100 of FIG. 1, the detail method is as follows: Under an epitaxial circumstance at a high temperature (larger than 950° C.), a first GaN layer 150 is grown on a buffer layer 130 on which is grown on a substrate 110 at a low temperature. Under an epitaxial circumstance at a middle temperature of between 700° C. and 900° C., a GaN middle layer (IT-IL) 170 is formed, and a second GaN layer 190 is grown on the GaN middle layer 170 at a high temperature. The objective of the prior art utilizes the GaN middle layer 170 which is formed at middle temperature epitaxial conditions to improve the epitaxial quality. However, the buffer layer 130, the first GaN layer 150 and the GaN middle layer 170 are all GaN group materials. The dislocations of the bottommost layer easily penetrate the GaN middle layer 170 to the interior of the device, and accordingly, the defects cannot be effectively eliminated.

Furthermore, U.S. Pat. No. 7,135,716 provides an LED. The LED is characterized in that a polarity conversion layer is formed in the LED. However, the polarity conversion layer is disposed on an amorphous buffer layer so the density of the defects in the material cannot be effectively reduced. The prior art utilizes $(Al_xIn_yGa_z)Mg_{3-(x+y+z)}N_2$ and $Si_aMg_{3-a}N_2$ as the II-III group Nitride or II-IV group Nitride. These materials differ from the III group nitride compound material. The growing condition is more complicated and severe, and is unfavorable to the manufacture.

In view of above, a new structure or a new manufacturing process of a semiconductor device needs to be developed. Accordingly, the objective to reduce the internal defects of the semiconductor device can be achieved. The yield of the process would be improved, and the reliability and working life of the device would be increased. The market of photoelectric devices will be satisfied by the development of such method.

SUMMARY OF THE INVENTION

The present invention provides a semiconductor device fabrication method. During an epitaxial process, an intermediate layer is formed by dopant with high concentration so as to reduce the dislocation defects inside a device.

The present invention provides a semiconductor device fabrication method comprising the steps of: providing a buffer layer and forming a first semiconductor layer on the buffer layer; forming an intermediate layer on the first semiconductor layer by dopant with high concentration during an epitaxial process; overlaying a second semiconductor layer on the intermediate layer, wherein the formation of the intermediate layer and the second semiconductor layer is a set of steps; and forming a semiconductor light emitting device on the second semiconductor layer.

The present invention provides a semiconductor device fabrication method comprising the steps of: providing a buffer layer and forming a first semiconductor layer on the buffer layer; forming a first intermediate layer on the first semiconductor layer by dopant with high concentration during an epitaxial process; overlaying a second semiconductor layer on the first intermediate layer; forming a second intermediate layer on the second semiconductor layer by dopant with high concentration during an epitaxial process; overlaying a third semiconductor layer on the second intermediate layer, wherein the formation of the second intermediate layer and the third semiconductor layer is a set of steps; and forming a semiconductor light emitting device on the third semiconductor layer.

The present invention provides a structure for reducing the internal defects of a semiconductor device comprising a first semiconductor layer, an intermediate layer, a second semiconductor layer and a semiconductor light emitting device. The intermediate layer is disposed on the first semiconductor, the second semiconductor layer is disposed on the intermediate layer, and the semiconductor light emitting device is disposed on the second semiconductor layer, wherein the intermediate layer and the second semiconductor layer are a set of sub-structures.

The present invention provides a structure for reducing the internal defects of a semiconductor device comprising a first semiconductor layer, a first intermediate layer, a second semiconductor layer, a second intermediate layer, a third semiconductor layer and a semiconductor light emitting device. The first intermediate layer is disposed on the first semiconductor layer, the second semiconductor layer is disposed on the first intermediate layer, the second intermediate layer is disposed on the second semiconductor layer, the third semiconductor layer is disposed on the second intermediate layer and the semiconductor light emitting device is disposed on the third semiconductor layer, wherein the second intermediate layer and the third semiconductor layer are a set of sub-structures.

The intermediate layer of the present invention is used to improve the lighting characteristics and electrical characteristics.

BRIEF DESCRIPTION OF THE DRAWINGS

The invention will be described according to the appended drawings in which.

DETAILED DESCRIPTION OF THE INVENTION

Figure 1:
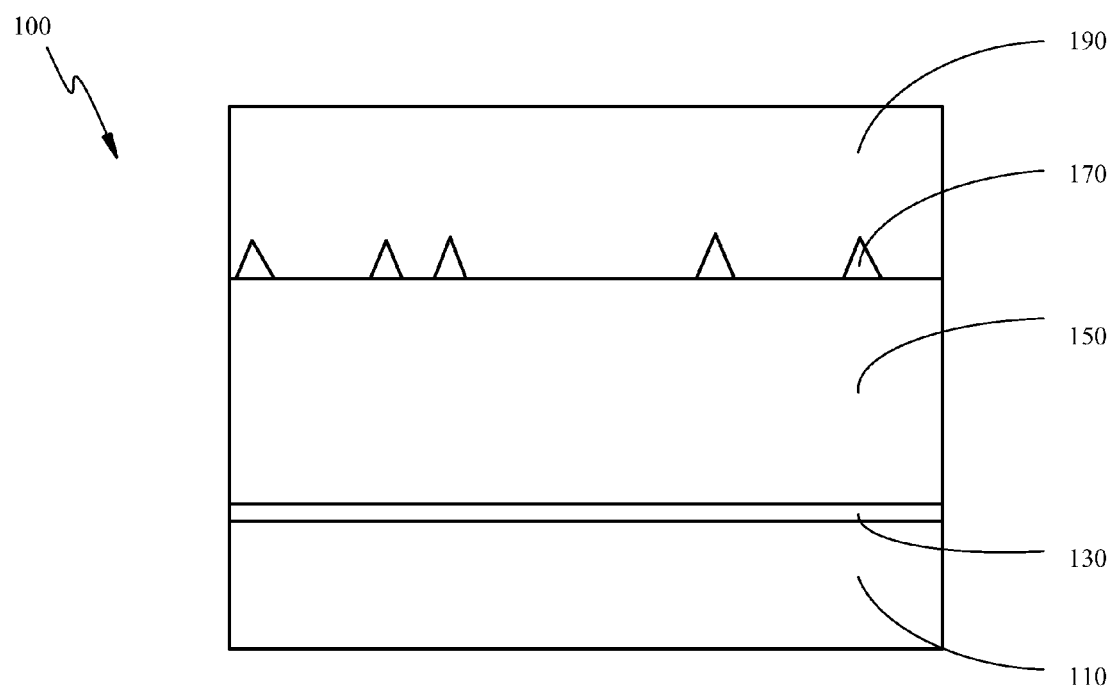
FIG. 1 is a schematic diagram illustrating an LED structure having a GaN middle layer (IT-IL) grown at a middle temperature disclosed in U.S. Pat. No. 6,534,332.

One aspect of the present invention proposes a semiconductor device fabrication method. In order to provide a thorough understanding of the present invention, a detailed description of a number of method steps and components is provided below. Clearly, the practice of the present invention is not limited to any specific detail of a light emitting device that is familiar to one skilled in the art. On the other hand, components or method steps that are well-known are not described in detail to avoid unnecessary limitations. A preferred embodiment of the present invention will be described in detail. However, in addition to the preferred embodiment described, other embodiments can be broadly employed, and the scope of the present invention is not limited by any of the embodiments, but should be defined in accordance with the following claims and their equivalent.

U.S. Pat. No. 6,861,270 discloses a GaN group compound semiconductor device for improving lighting efficiency. The primary method for manufacturing the device employed by the patent comprises the steps of: sequentially forming an n-type AlGaN semiconductor layer, a non-doped AlGaN semiconductor layer and a p-type AlGaN semiconductor layer; and interposing a discontinuous space perturbation layer (Ga, Al) so as to utilize the space perturbation layer to perturb the energy gaps of a lighting layer. Consequently, the lighting efficiency of the device is increased.

U.S. Pat. No. 6,462,357 discloses a Group III nitride-based compound semiconductor device for reducing the dislocation defects of crystal lattices occurring between the layers of Group III nitride during epitaxial processes. The essence of the method for manufacturing the device employed by the patent is to reduce the dislocation defects of crystal lattices through a single-crystal and island-shaped structure by forming a single-crystal and island-shaped Group II nitride ([Be, Mg, Ca, Sr, Ba, Zn, Cd, Hg]N) compound layer on a substrate or on the Group III nitride semiconductor layer overlaid on a substrate. Furthermore, the sizes and the distribution density of the single-crystal islands of the single-crystal and island-shaped layer are controlled by adjusting the parameters of the temperature and time during the growth of the Group II nitride. However, the condition of the single crystal growth is severe and not easily satisfied. Due to the characteristics of materials employed by the prior art, there are fewer adjustable parameters of the epitaxial processes, so an optimal device is very difficult to obtain.

U.S. Pat. No. 6,627,974 discloses a nitride semiconductor device with a T-shaped structure for controlling unfavorable effects during the growth of the nitride semiconductor device. The details of the method for manufacturing the device employed by the prior art are as follows: growing a protection layer on the surface of a nitride semiconductor layer overlaid on a substrate by a chemical vapor deposition (CVD) method or a sputtering method; patterning the protection layer into a specified profile such as a strip-shaped, grid-shaped or island-shaped structure through a photolithography process; then, growing a nitride semiconductor layer up from and out from the gaps of the protection layer; and stopping the growth to form the nitride semiconductor layer into a T-shaped structure before the protection layer is completely covered with the nitride semiconductor layer. Subsequently, other semiconductor layers can be sequentially formed on the T-shaped structure so that the dislocation defects between the semiconductor layers are reduced. The material of the protection layer can be a material ($SiO_x$, $Si_xN_y$, $TiO_x$ or $ZrO_x$) on which a nitride semiconductor material is not easily grown, and a T-shaped nitride semiconductor structure can be formed on the surface and in the gaps of the protection layer because of the aforesaid characteristics of the material of the protection layer. However, the processes of the prior art are complicated, and the processes of CVD, sputtering or photolithography utilized by the prior art are likely to contaminate the epitaxial surface of the substrate.

U.S. Pat. No. 6,345,063 utilizes $SiO_2$ and SiN as a patterned mask layer which is formed by the other process rather than MOCVD. The processes of the prior art are complicated and are likely to contaminate the epitaxial surface of the substrate. Furthermore, the prior art claims that an InGaN layer is directly formed on the mask layer and, consequently, the quality of epitaxial layers is not easy to maintain.

U.S. Pat. No. 6,794,210 claims that an anti-surfactant material is used to modify a substrate or GaN thin film to reduce the density of dislocation defects existing in thin films which are sequentially formed. The details of the method for manufacturing the device employed by the prior art is as follows: forming a GaN group compound semiconductor layer on a substrate; then, utilizing an anti-surfactant material such as Si to modify a portion of the surface of the GaN group compound semiconductor layer; shaping the unmodified portion of the surface of the GaN group compound semiconductor layer to be island-shaped protrusions and shaping the modified portion to be cavities. The objective of forming such an island-shaped structure is to utilize these cavities to block the dislocation defects propagating from the GaN group compound semiconductor layer so that the dislocation defects cannot extend to epitaxial layers which are sequentially formed. However, the modification process mentioned in the prior art needs to pause the supply of Ga source (TMGa) and ammonia, and the pause action easily damages the epitaxial thin films.

In view of the prior arts, their disadvantages are as follows: the defect barrier layers and the other epitaxial layers are made of GaN group materials so that the defects cannot be effectively reduced; the single-crystal growth processes are difficult to implement, and there are fewer adjustable parameters of the epitaxial processes so that an optimal device is very difficult to obtain; and the manufacturing processes are complicated, with additional processes being necessary for forming the barrier layers so that the epitaxial surface of the substrate is likely to be contaminated.

In contrast, the present invention provides a semiconductor device having a defect barrier layer (the present invention refers to a first intermediate layer as the defect barrier layer) which is completely grown during the entire epitaxial process. Accordingly, the dislocation defects inside a device resulting from lattice mismatch can be reduced. The process of the defect barrier layer of the present invention is simple and easy, and aforesaid problems of the prior arts can be resolved.

The present invention provides a semiconductor device fabrication method comprising the steps of: providing a buffer layer and forming a first semiconductor layer on the buffer layer; forming a first intermediate layer on the first semiconductor layer by dopant with high concentration during an epitaxial process; overlaying a second semiconductor layer on the first intermediate layer; and forming a semiconductor light emitting device on the second semiconductor layer, wherein the formation of the first intermediate layer and the second semiconductor layer is a set of steps, and the set of steps can be repeated several times before the semiconductor light emitting device is formed on the second semiconductor layer. In the present manufacturing method, there can be one or more sets of the first intermediate layer and the second semiconductor layer acting as overlay layers between the first semiconductor layer and the semiconductor light emitting device.

The materials of the buffer layer, the first semiconductor layer, the first intermediate layer, and the second semiconductor layer are Group III nitride semiconductor or $Al_xIn_yGa_{1-x-y}N$, where $0 \leq x, y \leq 1$. All of the first semiconductor layer and second semiconductor layer are semiconductor structures with a single layer or multiple layers.

In order to describe the aforesaid processes in further detail, the present invention further provides the manufacturing method of a semiconductor device comprising two sets of the first intermediate layers and the second semiconductor layers as overlay layers, with the method comprising the following steps: providing a buffer layer and forming a first semiconductor layer on the buffer layer; forming a first intermediate layer on the first semiconductor layer by dopant with high concentration during an epitaxial process; overlaying a second semiconductor layer on the first intermediate layer; forming a second intermediate layer on the second semiconductor layer by dopant with high concentration during an epitaxial process; overlaying a third semiconductor layer on the second intermediate layer; and forming a semiconductor light emitting device on the third semiconductor layer, wherein the formation of the second intermediate layer and the third semiconductor layer is the aforesaid set of steps.

Figure 2:
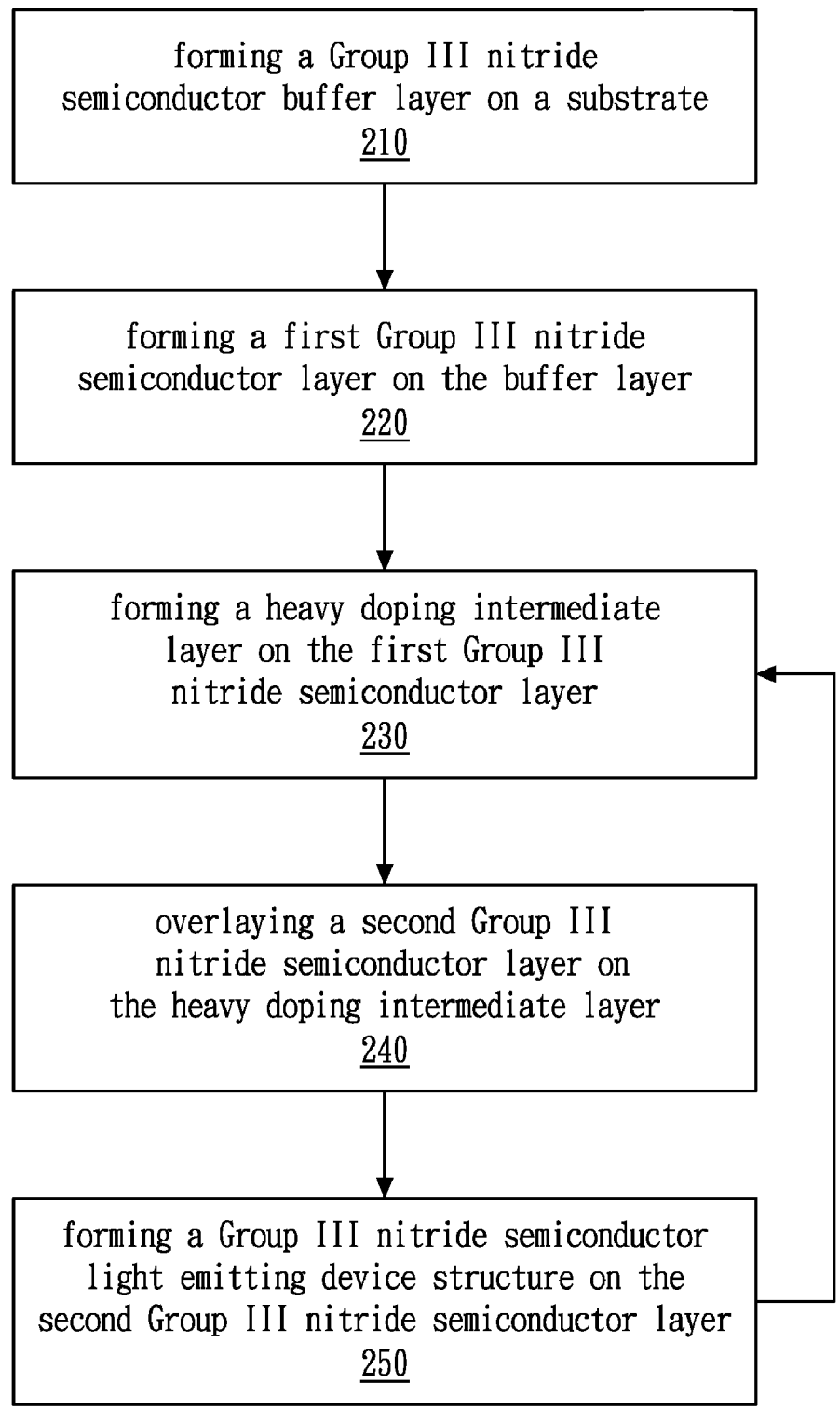
FIG. 2 is a flow chart of a semiconductor device fabrication method in accordance with the present invention.

FIG. 2 is a flow chart of a semiconductor device fabrication method in accordance with the present invention. The process flow essentially comprises five major steps. First, in step 210, a Group III nitride semiconductor buffer layer is formed on a substrate. Next, in step 220, a first Group III nitride semiconductor layer is formed on the buffer layer. A Group III nitride intermediate layer is formed on the first Group III nitride semiconductor layer by dopant with high concentration during an epitaxial process, as shown in step 230. In step 240, a second Group III nitride semiconductor layer is overlaid on the Group III nitride intermediate layer by doping popant with high concentration. Finally, in step 250, a Group III nitride semiconductor light emitting device structure is formed on the second Group III nitride semiconductor layer. As shown in FIG. 2, the arrow toward step 230 from step 240 indicates a repetition of step 230 and step 240. The set of steps can be repeated according to the process requirement. The present invention utilizes the repetition of these steps to reduce the dislocation defects inside materials.

Figure 3A:
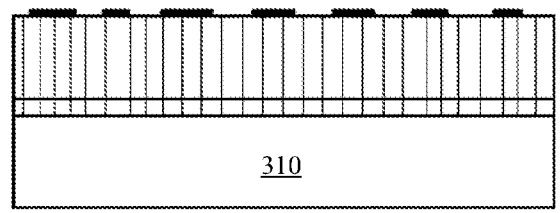
FIGS. 3A-3D are schematic diagrams illustrating the growth of an island-shaped structure, the formation of a semiconductor layer overlaid on an intermediate layer and the defect density within a device in accordance with the present invention.
Figure 3B:
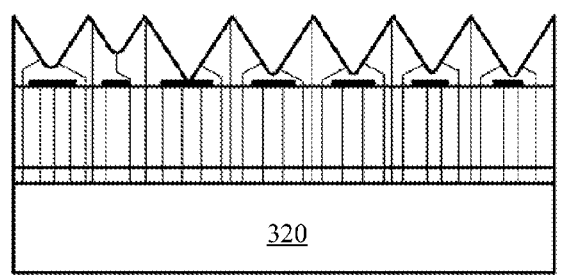
Figure 3C:
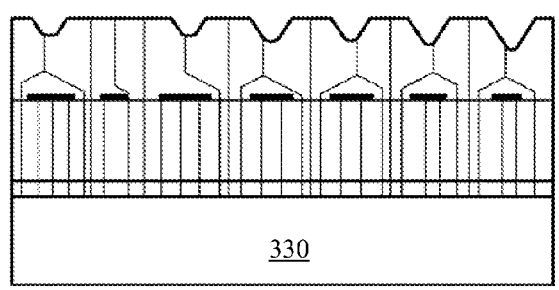
Figure 3D:
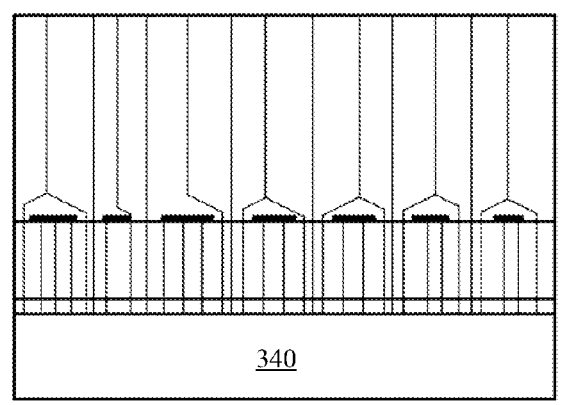
Figure 5A:
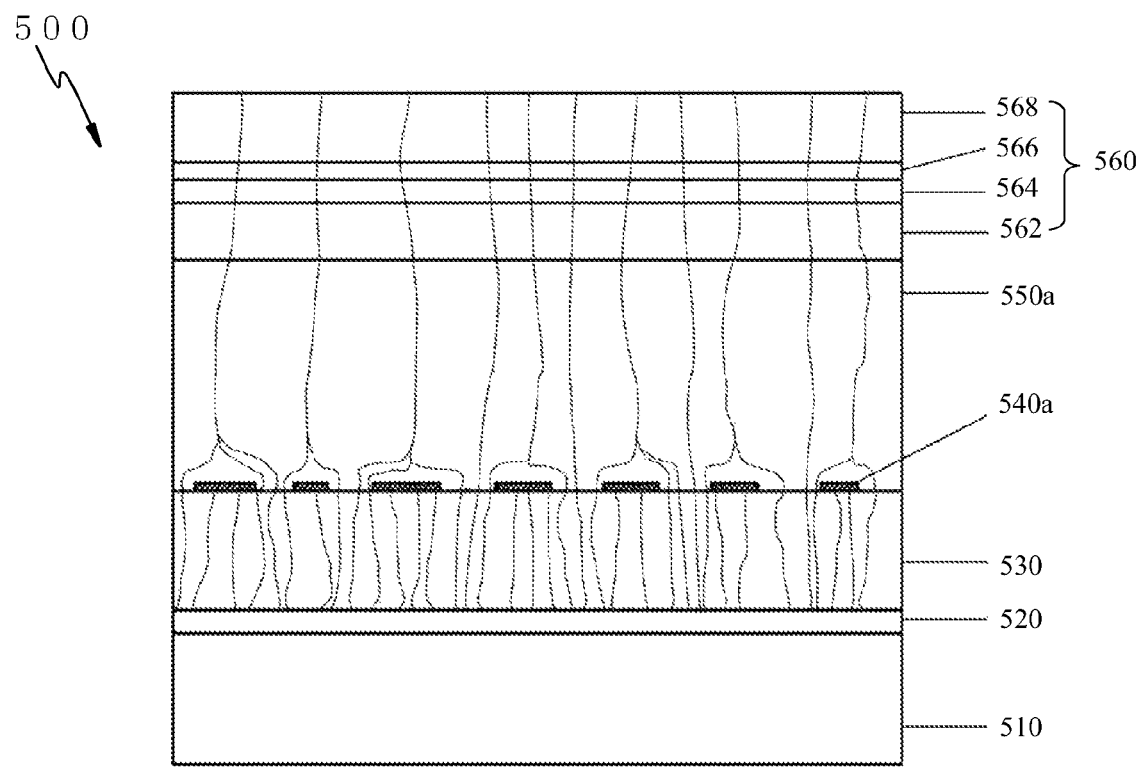
FIG. 5A is a diagram of a structure (including an intermediate layer) for reducing defects inside the semiconductor device in accordance with the present invention.
Figure 5B:
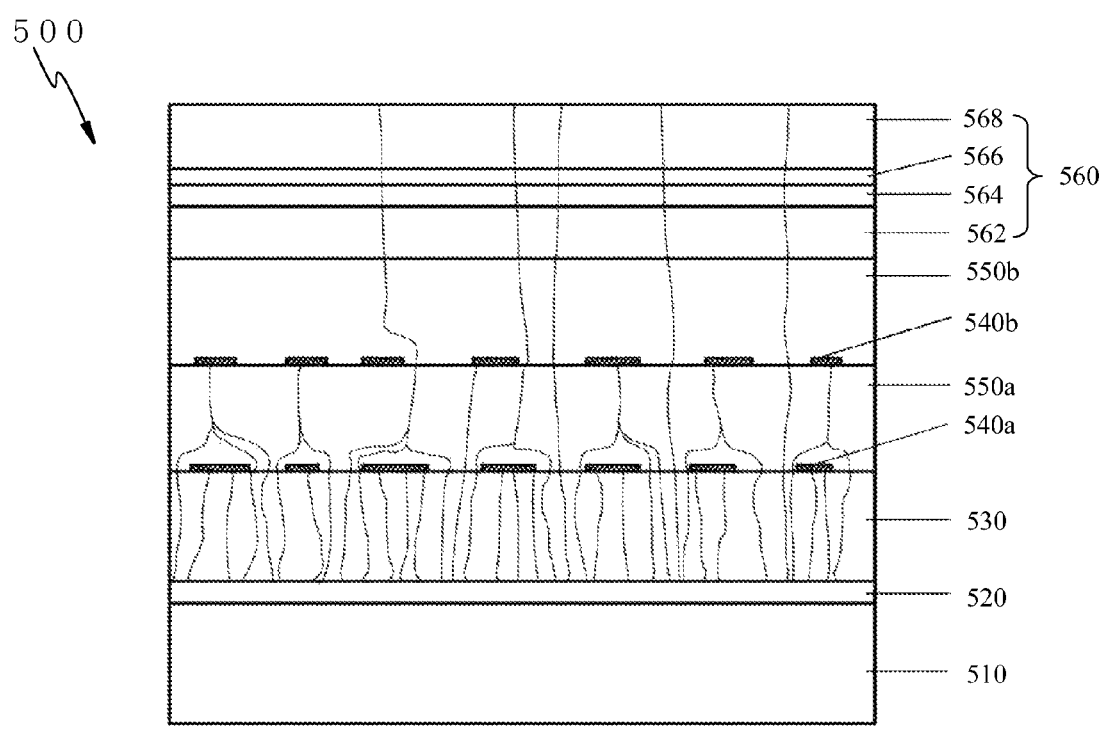
FIG. 5B is a diagram of a structure (including two intermediate layers) for reducing defects inside the semiconductor device in accordance with the present invention.

The formation of the intermediate layer of the present invention utilizes Group III nitride semiconductor materials or $Al_xIn_yGa_{1-x-y}N$ by doping a material such as Be, Mg, Ca, Sr, Ba, Zn, Cd, Hg, Si, Ge, Sn with high concentration under the control of constant dopant concentration, increasing dopant concentration or decreasing dopant concentration. Accordingly, a first intermediate layer 540a in FIG. 5A is formed, or a second intermediate layer 540b in FIG. 5B is formed. Please also refer to structure 310 shown in FIG. 3A. After the first intermediate layer 540a is fully grown, the doping of materials with high concentration is stopped and the epitaxial process of Group III nitride semiconductor or $Al_xIn_yGa_{1-x-y}N$ is continued. Next, a second semiconductor layer 550a is formed on the first intermediate layer 540a. Please refer to structures 320-340 shown in FIG. 3, which is a schematic diagram of the formation of the second semiconductor layer as an overlay layer. During the overlaying of the second semiconductor layer, a discontinuous island-shaped structure appears like the profile of the numeral reference 320 of FIG. 3. As the growth advances over time, the separated islands get bigger and connect to each other like the numeral reference 330 of FIG. 3. Finally, an even second semiconductor layer is obtained like the numeral reference 340 of FIG. 3. After the second semiconductor layer is fully grown, the second intermediate layer 540b is obtained if doping a material with high concentration is implemented again. Please refer to the structure diagram as shown in FIG. 5B.

The concentration of Mg doped in the intermediate layer ranges from $1.0 \times 10^{20}$ cm$^{-3}$ to $9.9 \times 10^{22}$ cm$^{-3}$, and a preferable range is from $5.0 \times 10^{20}$ cm$^{-3}$ to $5.0 \times 10^{21}$ cm$^{-3}$. The concentration of Si doped in the intermediate layer ranges from $1.0 \times 10^{19}$ cm$^{-3}$ to $9.9 \times 10^{22}$ cm$^{-3}$ and a preferable range is from $1.0 \times 10^{20}$ cm$^{-3}$ to $5.0 \times 10^{21}$ cm$^{-3}$. The concentration of Mg and Si doped in the intermediate layer ranges from $1.0 \times 10^{19}$ cm$^{-3}$ to $9.9 \times 10^{22}$ cm$^{-3}$, and a preferable range is from $1.0 \times 10^{20}$ cm$^{-3}$ to $5.0 \times 10^{21}$ cm$^{-3}$. Furthermore, the period of doping is from 10 seconds to 10 minutes for the formation of the intermediate layer.

Figure 4A:
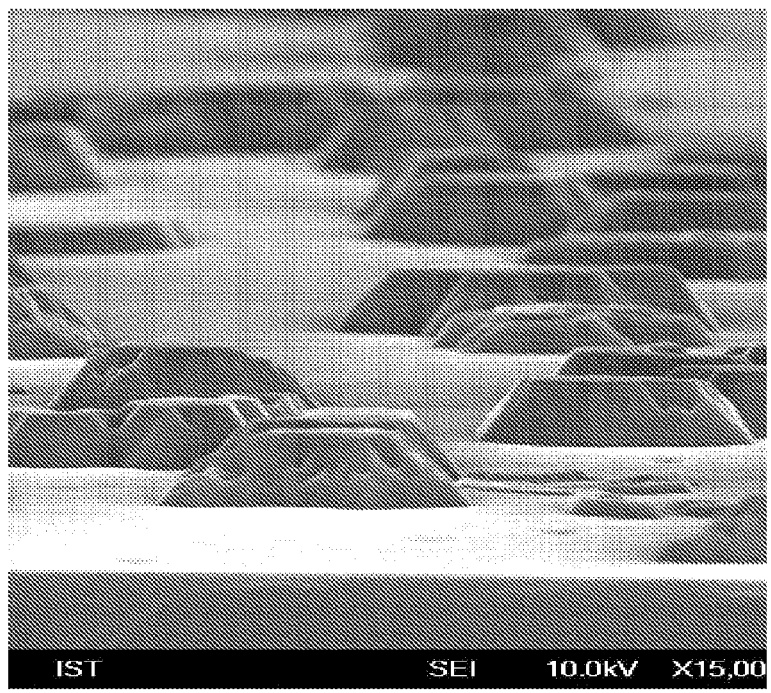
FIG. 4A is a surface configuration diagram of a second semiconductor layer overlaid on a first intermediate layer doped with Group II atoms of doping concentration $8.8 \times 10^{21}$ $cm^{-3}$ in accordance with the present invention.
Figure 4B:
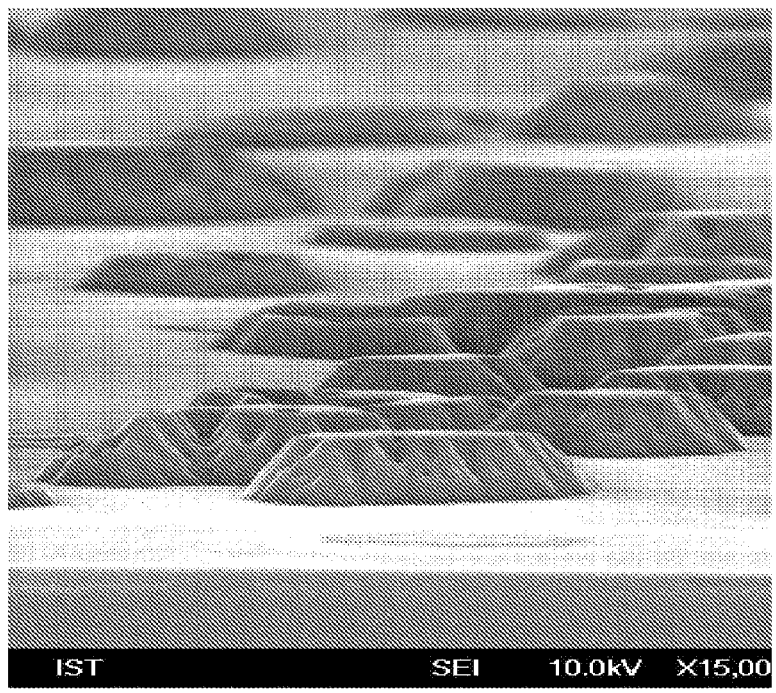
FIG. 4B is a surface configuration diagram of a second semiconductor layer overlaid on a first intermediate layer doped with Group II atoms of doping concentration $2.9 \times 10^{21}$ $cm^{-3}$ in accordance with the present invention.
Figure 4C:
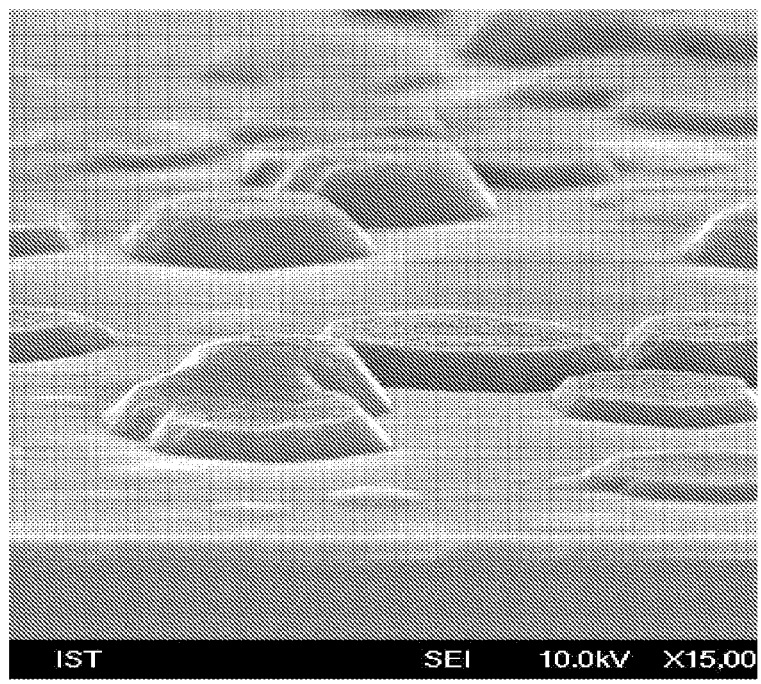
FIG. 4C is a surface configuration diagram of a second semiconductor layer overlaid on a first intermediate layer doped with Group II atoms of doping concentration $1.5 \times 10^{21}$ $cm^{-3}$ in accordance with the present invention.
Figure 4D:
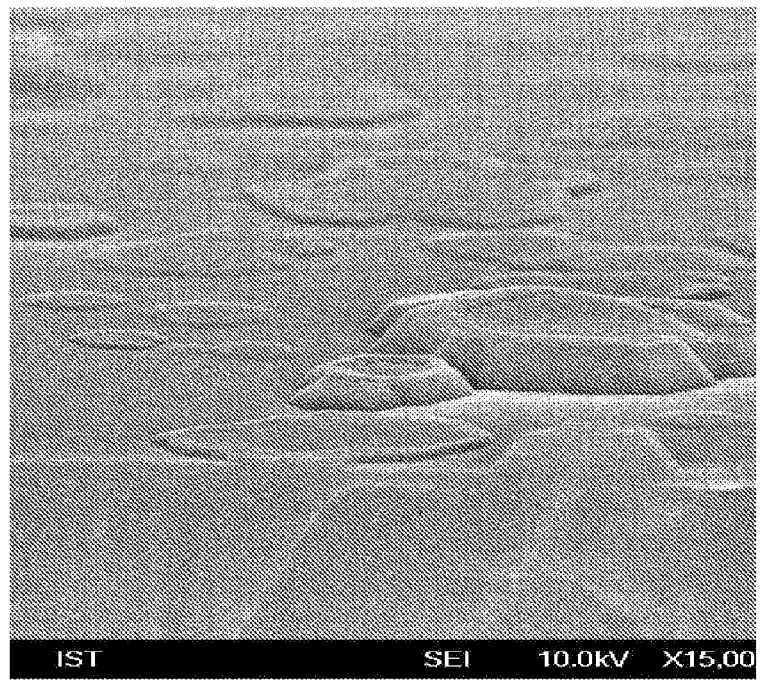
FIG. 4D is a surface configuration diagram of a second semiconductor layer overlaid on a first intermediate layer doped with Group II atoms of doping concentration $8.8 \times 10^{20}$ $cm^{-3}$ in accordance with the present invention.
Figure 4E:
FIG. 4E is a surface configuration diagram of a second semiconductor layer overlaid on a first intermediate layer doped with Group II atoms of doping concentration $6.3 \times 10^{20}$ $cm^{-3}$ in accordance with the present invention.
Figure 4F:
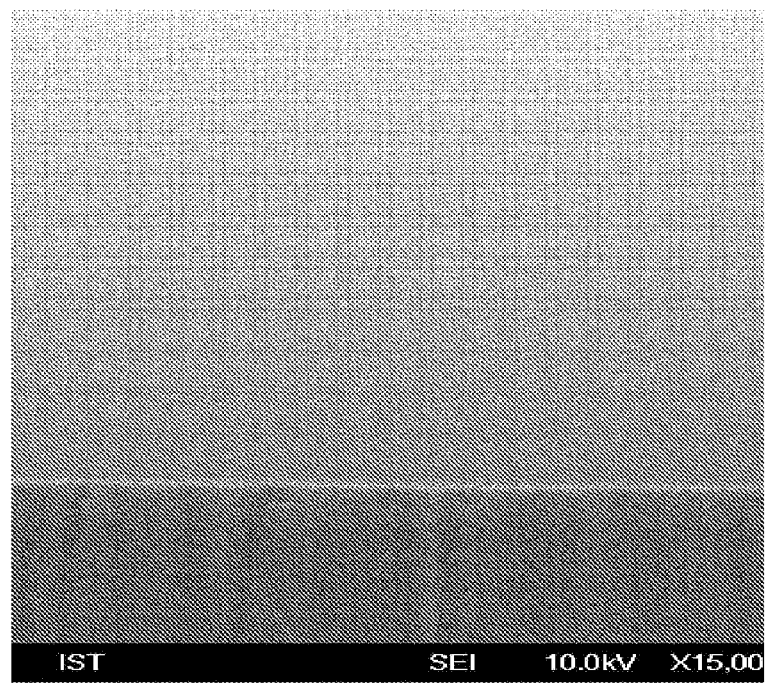
FIG. 4F is a surface configuration diagram of a second semiconductor layer overlaid on a first intermediate layer doped with Group II atoms of doping concentration $4.9 \times 10^{20}$ $cm^{-3}$ in accordance with the present invention.

FIGS. 4A to 4F are surface configuration diagrams of a second semiconductor layer overlaid on a first intermediate layer doped with Group II atoms of various doping concentration in accordance with the present invention. The doping concentrations are respectively $8.8 \times 10^{21}$ cm$^{-3}$, $2.9 \times 10^{21}$ cm$^{-3}$, $1.5 \times 10^{21}$ cm$^{-3}$, $8.8 \times 10^{20}$ cm$^{-3}$, $6.3 \times 10^{20}$ cm$^{-3}$ and $4.9 \times 10^{20}$ cm$^{-3}$. FIG. 4A has the highest doping concentration. Compared with FIG. 4F, which has the lowest doping concentration, the surface configuration of FIG. 4A shows island-shaped protrusions with greater height and density. That is, the second or third semiconductor layer overlaid on the intermediate layer can appear as an island-shaped structure when the concentration of dopant doped in the intermediate layer is higher than a certain value during the epitaxial process. Furthermore, if the doping concentration is higher, the island-shaped structure and protrusions are more obvious. Therefore, the doping concentration of heavy dopant is different for each of the step sets of forming an intermediate layer and overlaying a second semiconductor layer. For example, the doping concentration is gradually decreased by each step set, or is gradually increased by each step set. Alternatively, the doping concentration of each step set is adjusted according to the process requirement.

FIG. 3 shows a schematic diagram of defect density. The dislocation defects (represented by threadlike lines) existing in the first semiconductor layer below the intermediate layer of the structure 310 number up to 28 lines. Because the intermediate layer is interposed between the first semiconductor layer and the second semiconductor layer, some of the dislocation defects existing in the first semiconductor layer are blocked from continuously extending. Therefore, the second semiconductor layer sequentially formed on the first semiconductor layer has fewer dislocation defects propagating from the first semiconductor layer. There are 13 dislocation defect lines in the second semiconductor layer of structure 340. The intermediate layer of the present invention can block the dislocation defects inside materials at the bottom layers of a device or combine several dislocation defects into one so that the number of dislocation defects inside the device is reduced.

The present invention provides a structure 500 for reducing the defects inside a semiconductor device, as shown in FIG. 5A. From the bottommost layer to the uppermost layer of the structure 500 are a substrate 510, a semiconductor buffer layer 520, a first semiconductor layer 530, a first intermediate layer 540a, a second semiconductor layer 550a and a semiconductor light emitting device 560. The semiconductor light emitting device 560 comprises an n-type Group III nitride semiconductor conducting layer 562, a Group III nitride semiconductor lighting layer 564, a p-type Group III nitride semiconductor barrier layer 566 and a p-type Group III nitride semiconductor conducting layer 568.

The first intermediate layer 540a is disposed on the surface of the first semiconductor layer 530, and is between the second semiconductor layer 550a and the first semiconductor layer 530. The combination of the first intermediate layer 540a and the second semiconductor layer 550a is a set of sub-structures. More sets of sub-structures can be interposed between the semiconductor light emitting device 560 and the second semiconductor layer 550a. In the structure 500 of the semiconductor device, the sub-structures between the semiconductor light emitting device 560 and the first semiconductor layer 530 comprises at least a set of the first intermediate layer 540a and the second semiconductor layer 550a. Furthermore, the second semiconductor layer overlaid on the intermediate layer closest to the Group III nitride semiconductor lighting layer 564 can also be an n-type Group III nitride semiconductor conducting layer. The materials of the semiconductor buffer layer 520, the first semiconductor layer 530, the first intermediate layer 540a, and the second semiconductor layer 550a are Group III nitride semiconductor or $Al_xIn_yGa_{1-x-y}N$, where $0 \leq x$, $y \leq 1$.

The present invention provides a structure 500 for reducing the defects inside a semiconductor device, as shown in FIG. 5B. From the bottom layer to the uppermost layer of the structure 500 are a substrate 510, a semiconductor buffer layer 520, a first semiconductor layer 530, a first intermediate layer 540a, a second semiconductor layer 550a, a second intermediate layer 540b, a third semiconductor layer 550b, and a semiconductor light emitting device 560. The semiconductor light emitting device 560 comprises an n-type Group III nitride semiconductor conducting layer 562, a Group III nitride semiconductor lighting layer 564, a p-type Group III nitride semiconductor barrier layer 566 and a p-type Group III nitride semiconductor conducting layer 568.

The first intermediate layer 540a is disposed on the surface of the first semiconductor layer 530, and is between the first semiconductor layer 530 and the second semiconductor layer 550a. The second intermediate layer 540b is disposed on the surface of the second semiconductor layer 550a, and is between the second semiconductor layer 550a and the third semiconductor layer 550b. The combination of the second intermediate layer 540b and the third semiconductor layer 550b is a set of sub-structures. More sets of sub-structures can be interposed between the semiconductor light emitting device 560 and the second semiconductor layer 550a. In the structure 500 of the semiconductor device, there is a plurality of sets of sets of the intermediate layer and the semiconductor layer overlaid on the intermediate layer between the semiconductor light emitting device 560 and the first semiconductor layer 530. Furthermore, the second semiconductor layer overlaid on the intermediate layer closest to the Group III nitride semiconductor lighting layer 564 can also be an n-type Group III nitride semiconductor conducting layer. The materials of the semiconductor buffer layer 520, the first semiconductor layer 530, the first intermediate layer 540*a*, the second semiconductor layer 550*a*, the second intermediate layer 540*b* and the third semiconductor layer 550*b* are Group III nitride semiconductor or $Al_xIn_yGa_{1-x-y}N$, where $0 \leq x, y \leq 1$.

The dopant material of the aforesaid intermediate layers is one or the combination of the following materials: Be, Mg, Ca, Sr, Ba, Zn, Cd, Hg, Si, Ge, and Sn. The concentration of Mg doped in the intermediate layer ranges from $1.0 \times 10^{20}$ $cm^{-3}$ to $9.9 \times 10^{22}$ $cm^{-3}$, and a preferable range is from $5.0 \times 10^{20}$ $cm^{-3}$ to $5.0 \times 10^{22}$ $cm^{-3}$. The concentration of Si doped in the intermediate layer ranges from $1.0 \times 10^{19}$ $cm^{-3}$ to $9.9 \times 10^{22}$ $cm^{-3}$, and a preferable range is from $1.0 \times 10^{20}$ $cm^{-3}$ to $5.0 \times 10^{21}$ $cm^{-3}$. The concentration of Mg and Si doped in the intermediate layer ranges from $1.0 \times 10^{19}$ $cm^{-3}$ to $9.9 \times 10^{22}$ $cm^{-3}$, and a preferable range is from $1.0 \times 10^{20}$ $cm^{-3}$ to $5.0 \times 10^{21}$ $cm^{-3}$.

The above-described embodiments of the present invention are intended to be illustrative only. Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device, comprising steps of:
   providing a buffer layer on a substrate;
   forming a first semiconductor layer on a surface of said buffer layer;
   doping dopant into said first semiconductor layer to form an intermediate layer on a surface of said first semiconductor layer in an epitaxial process;
   covering a second semiconductor layer on a surface of said intermediate layer, wherein said step of forming said intermediate layer and said step of covering said second semiconductor layer on said surface of said intermediate layer are regarded as a procedure; and
   forming a semiconductor light emitting device on said second semiconductor layer;
   wherein the dopant in said intermediate layer is one of Be, Mg, Ca, Sr, Ba, Zn, Cd, Hg, Si, Ge, and Sn, or the mixture thereof and wherein a doping concentration of said Mg in said intermediate layer is between $1.0 \times 10^{20}$ $cm^{-3}$ and $9.9 \times 10^{22}$ $cm^{-3}$; and
   wherein a doping concentration of the mixture of said Mg and said Si in said intermediate layer ranges from $1.0 \times 10^{20}$ $cm^{-3}$ and $5.0 \times 10^{21}$ $cm^{-3}$.

2. The method for fabricating a semiconductor device according to claim 1, further comprising a step of performing said procedure repeatedly on said surface of said first semiconductor layer prior to said step of forming said semiconductor light emitting device on said second semiconductor layer.

3. The method for fabricating a semiconductor device according to claim 1, wherein the materials of said buffer layer, said first semiconductor layer, said intermediate layer, and said second semiconductor layer are Group III nitride compound semiconductor or AlxInyGa1-x-yN, where $0 \leq x$ and $y \leq 1$.

4. The method for fabricating a semiconductor device according to claim 1, wherein a doping duration of forming said intermediate layer is between about 10 seconds and 10 minutes.

5. The method for fabricating a semiconductor device according to claim 1, wherein said intermediate layer is used to decrease defects inside said semiconductor light emitting device.

6. The method for fabricating a semiconductor device according to claim 1, wherein said first semiconductor layer is a semiconductor structure with a single layer or multiple layers.

7. The method for fabricating a semiconductor device according to claim 1, wherein said second semiconductor device is a semiconductor structure with a single layer or multiple layers.

8. The method for fabricating a semiconductor device according to claim 1, wherein the doping concentration of said Mg in said intermediate layer ranges from $5.0 \times 10^{20}$ $cm^{-3}$ to $5.0 \times 10^{22}$ $cm^{-3}$.

9. The method for fabricating a semiconductor device according to claim 1, wherein a doping concentration of said Si in said intermediate layer ranges from $1.0 \times 10^{20}$ $cm^{-3}$ to $5.0 \times 10^{21}$ $cm^{-3}$.

* * * * *